(12) United States Patent
Yamazaki et al.

(10) Patent No.: US 8,022,754 B2
(45) Date of Patent: Sep. 20, 2011

(54) DEMODULATION CIRCUIT

(75) Inventors: Daisuke Yamazaki, Kawasaki (JP); Andrzej Radecki, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/482,224

(22) Filed: Jun. 10, 2009

(65) Prior Publication Data

US 2009/0243716 A1      Oct. 1, 2009

Related U.S. Application Data

(63) Continuation of application No. PCT/JP2007/055029, filed on Mar. 14, 2007.

(51) Int. Cl.
  *H03D 1/18*      (2006.01)
(52) U.S. Cl. ........................................ 329/369; 329/370
(58) Field of Classification Search .................. 329/369, 329/370
  See application file for complete search history.

(56) References Cited

U.S. PATENT DOCUMENTS

| 4,143,330 | A | * | 3/1979 | Nagasawa ..................... 329/369 |
| 4,492,926 | A | * | 1/1985 | Kusakabe et al. ............. 329/349 |
| 5,594,384 | A | * | 1/1997 | Carroll et al. ................. 329/369 |
| 6,608,995 | B1 | | 8/2003 | Kawasaki et al. |
| 2005/0219110 | A1 | | 10/2005 | Missoni |
| 2006/0071654 | A1 | * | 4/2006 | Mizuno et al. .................. 324/85 |

FOREIGN PATENT DOCUMENTS

| JP | 2001-044764 | 2/2001 |
| JP | 2004-194301 | 7/2004 |
| JP | 2005-142778 A | 6/2005 |

* cited by examiner

*Primary Examiner* — Joseph Chang
(74) *Attorney, Agent, or Firm* — Arent Fox, LLP

(57) ABSTRACT

A demodulation circuit, including: an input terminal (IN) inputting a current amplitude modulated signal; a first transistor (101) connected to the input terminal; a capacitance (105) connected to a control terminal of the first transistor; a diode (102) connected between the input terminal and the control terminal of the first transistor; and a first current source (104) applying a current of the input terminal, is provided.

19 Claims, 10 Drawing Sheets

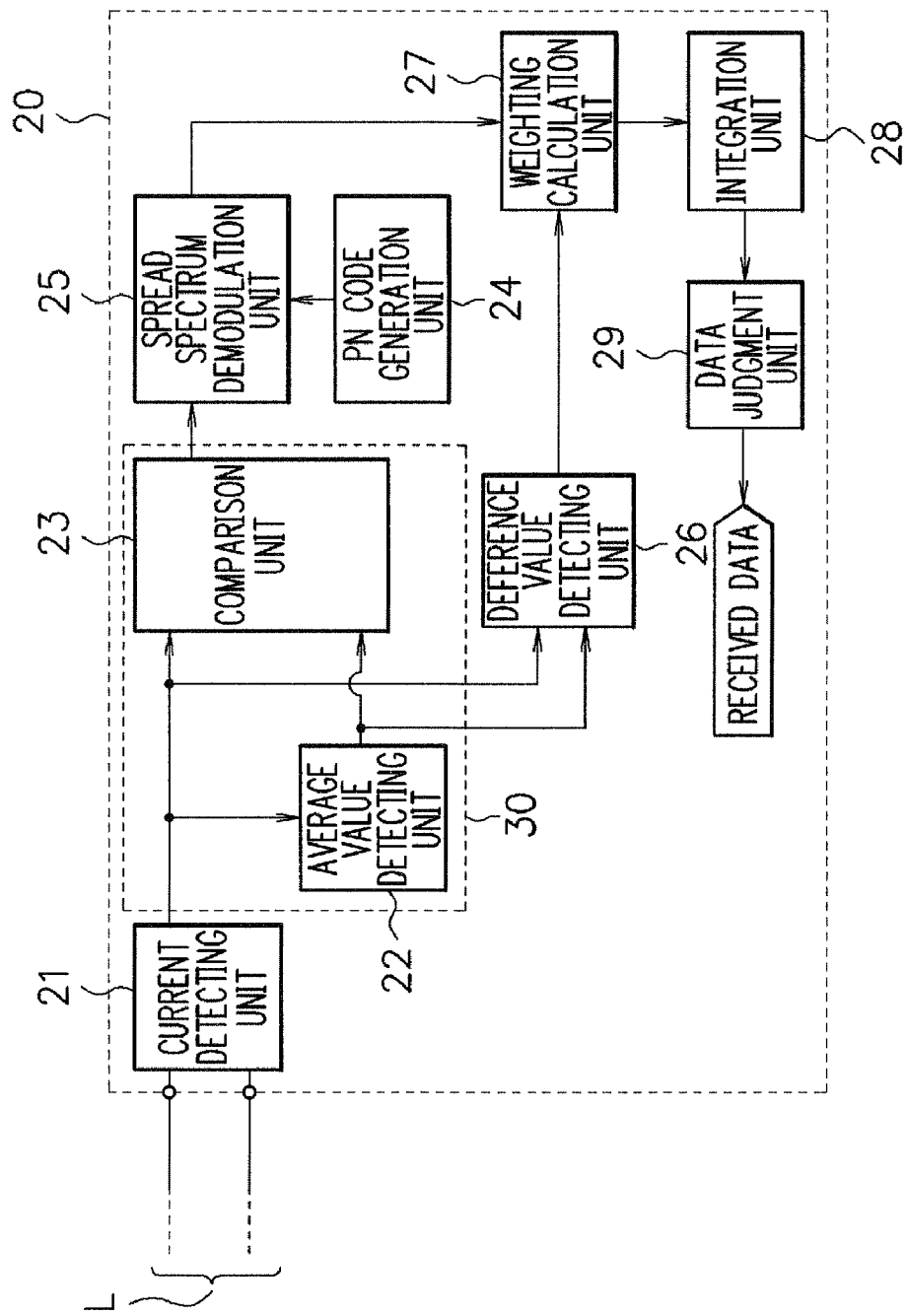
F I G. 18

DEMODULATION CIRCUIT

CROSS-REFERENCE TO RELATED APPLICATIONS

This application is a Continuation of International Application No. PCT/JP2007/055029, with an international filing date of Mar. 14, 2007, which designating the United States of America, the entire contents of which are incorporated herein by reference.

TECHNICAL FIELD

The present invention relates to a demodulation circuit.

BACKGROUND ART

FIG. 18 is a view illustrating a configuration of a receiving unit 20 of a power line communication system in later-described Patent Document 1. The receiving unit 20 is constituted by a current detecting unit 21, an average value detecting unit 22, a comparison unit 23, a PN code generation unit 24, a spread spectrum demodulation unit 25, a difference value detecting unit 26, a weighting calculation unit 27, an integration unit 28 and a data judgment unit 29. The average value detecting unit 22 and the comparison unit 23 constitute a demodulation circuit 30.

The current detecting unit 21 detects and outputs a value of a current flowing in a current line L, namely, a current value of the current line L. The average value detecting unit 22 asks and outputs an average value of the current values flowing in the current lines L. The comparison unit 23 has a function comparing a size of the current value according to a current value signal detected by the current detecting unit 21 relative to average value information outputted from the average value detecting unit 22, and outputting the result of the comparison as an ASK (Amplitude Shift Keying) demodulation signal, namely an ASK demodulation function. The PN code generation unit 24 generates and outputs a spread signal based on a predetermined spread code. The spread spectrum demodulation unit 25 inversely spreads the ASK demodulation signal outputted from the comparison unit 23 by using the spread signal of the PN code generation unit 24. The difference value detecting unit 26 asks and outputs a difference value of the current value signal outputted from the current detecting unit 21 relative to the average value information outputted from the average value detecting unit 22. The weighting calculation unit 27 performs a weighting for the inverse spread demodulation signal inversely spread and demodulated by the spread spectrum demodulation unit 25 based on difference value information outputted from the difference value detecting unit 26. The integration unit 28 integrates and outputs the inverse spread demodulation signal after weighting weighted by the weighting calculation unit 27 with a predetermined cycle unit. The data judgment unit 29 performs a binary judgment of integrated value information from the integration unit 28 based on a predetermined threshold value, and outputs a received data (received information signal).

Besides, a circuit to demodulate a voltage which is ASK modulated by changing an amplitude between low-level and high-level is described in later-described Patent Document 2.

Patent Document 1: Japanese Patent Application Laid-open No. 2005-142778
Patent Document 2: Japanese Patent Application Laid-open No. 2006-502684

SUMMARY OF THE INVENTION

An object of the present invention is to provide a demodulation circuit capable of performing a high accurate demodulation with high noise resistance.

According to an aspect of the present invention, a demodulation circuit is provided in which: an input terminal inputting a current amplitude modulated signal; a first transistor connected to the input terminal; a capacitance connected to a control terminal of the first transistor; a diode connected between the input terminal and the control terminal of the first transistor; and a first current source applying a current of the input terminal are included.

BRIEF DESCRIPTION OF THE DRAWINGS

FIG. 18 is a view illustrating a configuration of a receiving unit of a power line communication system in Patent Document 1;

DETAILED DESCRIPTION OF THE PREFERRED EMBODIMENTS

Figure 19:
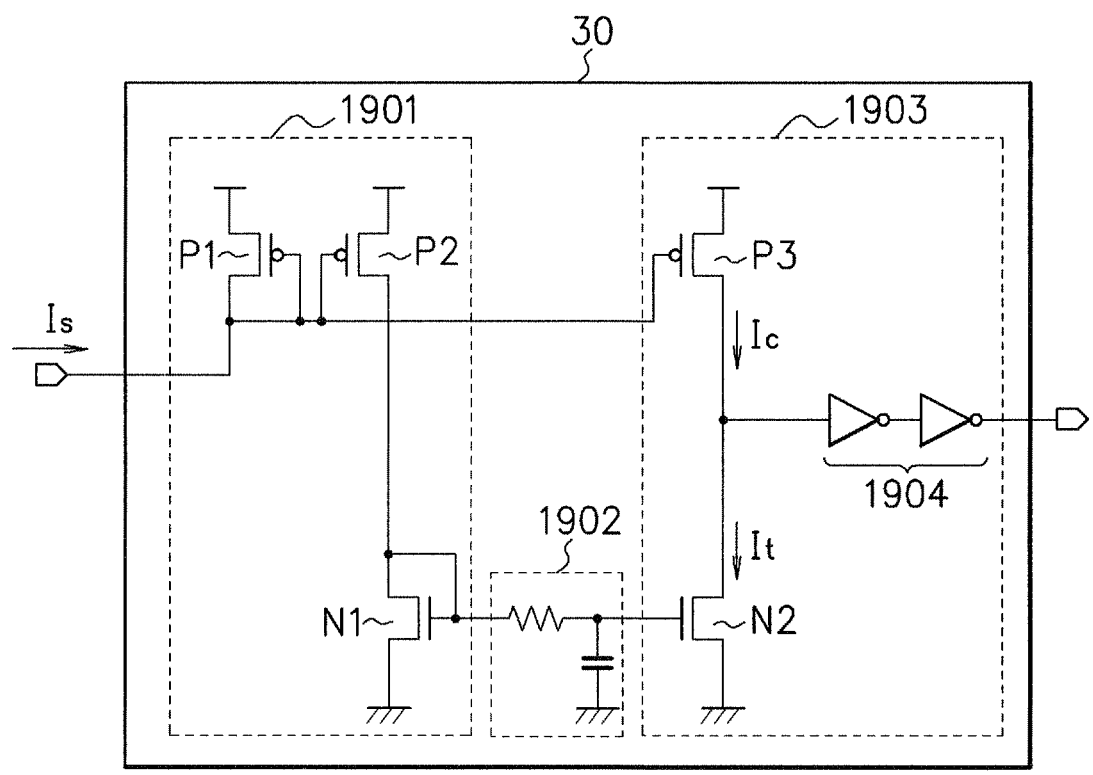
FIG. 19 is a view illustrating a configuration example conceivable to provide a demodulation circuit in FIG. 18.

FIG. 19 is a view illustrating a configuration example conceivable to provide a demodulation circuit 30 in FIG. 18. The demodulation circuit 30 has a branching unit 1901, an average value detecting unit 1902 and a comparison unit 1903. The branching unit 1901 has p-channel MOS field-effect transistors P1, P2 and an n-channel MOS field-effect transistor N1. The average value detecting unit 1902 has a resistance and a capacitance. The comparison unit 1903 has a p-channel MOS field-effect transistor P3, an n-channel MOS field-effect transistor N2 and a buffer 1904.

The p-channel transistors P2 and P3 constitute a first current mirror, and apply a signal current Ic in accordance with an input current Is. Besides, the n-channel transistors N1 and N2 constitute a second current mirror, and apply a threshold current It.

Figure 20:
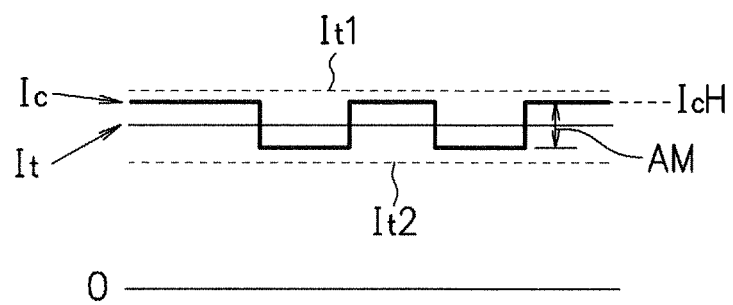
FIG. 20 is a time chart to explain an operation of the demodulation circuit in FIG. 19.

FIG. 20 is a time chart to explain an operation of the demodulation circuit in FIG. 19. The signal current Ic changes into a high-level current IcH or a low-level current in accordance with the input current Is. An amplitude AM of the signal current Ic is a difference between the high-level current IcH and the low-level current. A modulation rate of the signal current Ic is represented by AM/IcH. When the signal current Ic is larger than the threshold current It, it is demodulated as high-level, and when the signal current Ic is smaller than the threshold current It, it is demodulated as low-level.

Here, variation occurs in the threshold current It resulting from an offset of the first current mirror (transistors P2 and P3) and the second current mirror (transistors N1 and N2). For example, the signal current Ic is constantly demodulated as low-level even if the signal current Ic is in high-level or in low-level when the threshold current It becomes a current It1 resulting from the variation. On the other hand, the signal current Ic is constantly demodulated as high-level even if the signal current Ic is in high-level or in low-level when the threshold current It becomes a current It2 resulting from the variation. In these cases, a problem occurs in which a yield of the demodulation circuit becomes worse because a normal demodulation cannot be performed.

First Embodiment

Figure 1:
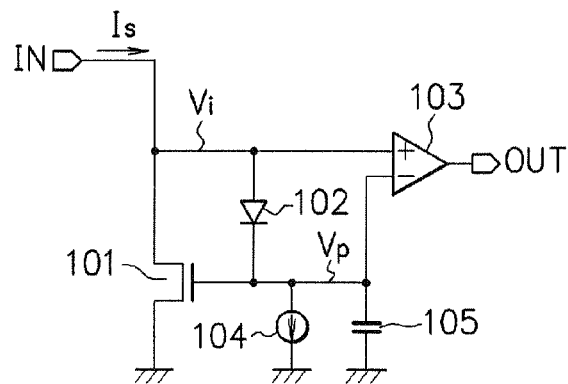
FIG. 1 is a circuit diagram illustrating a configuration example of a demodulation circuit according to a first embodiment of the present invention.

FIG. 1 is a circuit diagram illustrating a configuration example of a demodulation circuit according to a first embodiment of the present invention. The demodulation circuit demodulates an intensity modulation (ASK modulation) signal representing whether a logic is "1" or "0" (zero) depending on whether a current is large or small. For example, in the demodulation circuit, a tag IC receives a signal from a reader/writer, and the demodulation circuit is able to demodulate a signal extracted as a current.

A current amplitude modulated (ASK modulated) signal Is is inputted to an input terminal IN. In an n-channel MOS field-effect transistor 101, a drain is connected to the input terminal IN, a gate (control terminal) is connected to a negative input terminal (inverting input terminal) of a comparator 103, and a source is connected to a reference potential (ground potential). In a diode 102, an anode is connected to the input terminal IN, and a cathode is connected to the gate of the transistor 101. A current source 104 is connected between the gate of the transistor 101 and the reference potential. A capacitance 105 is connected between the gate of the transistor 101 and the reference potential in parallel to the current source 104. In the comparator 103, a positive input terminal (non-inverting input terminal) is connected to the input terminal IN, and the negative input terminal is connected to the gate of the transistor 101, and an output terminal is connected to an output terminal OUT. An input voltage Vi is a voltage of the input terminal IN. A voltage Vp is a gate voltage of the transistor 101. The comparator 103 compares the input voltage Vi and the voltage Vp, and outputs high-level to the output terminal OUT when the input voltage Vi is higher than the voltage Vp, and outputs low-level to the output terminal OUT when the input voltage Vi is lower than the voltage Vp.

Figure 2:
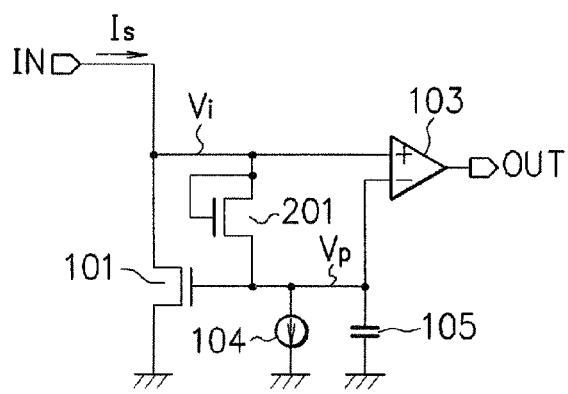
FIG. 2 is a circuit diagram illustrating a more concrete configuration example of the demodulation circuit in FIG. 1.

FIG. 2 is a circuit diagram illustrating a more concrete configuration example of the demodulation circuit in FIG. 1. The diode 102 in FIG. 1 can be constituted by an n-channel MOS field-effect transistor 201 in FIG. 2. In the transistor 201, a gate and a drain are connected to the input terminal IN, and a source is connected to the gate of the transistor 101.

Figure 3:
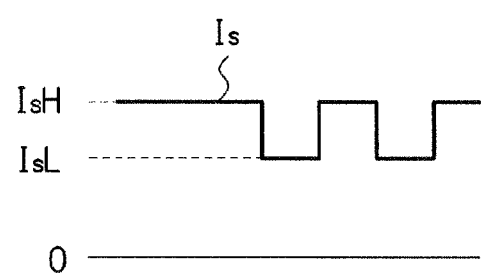
FIG. 3 is a time chart illustrating a waveform example of an input current.

FIG. 3 is a time chart illustrating a waveform example of the input current Is. The input current Is is the ASK signal which is ASK modulated, and a high-level current IsH flows when it is in high-level, and a low-level current IsL flows when it is in low-level.

Figure 4:
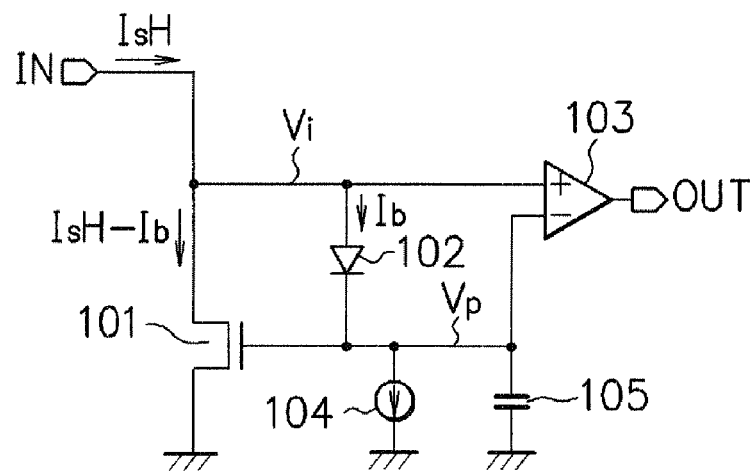
FIG. 4 is a circuit diagram to explain an operation of the demodulation circuit in FIG. 1 when the input current is in high-level.

FIG. 4 is a circuit diagram to explain an operation of the demodulation circuit in FIG. 1 when the input current Is is in high-level. The high-level current IsH flows in the input terminal IN. Accordingly, the voltage Vi becomes high, the diode 102 turns on, and a bias current Ib flows in the diode 102. A current of IsH-Ib flows between the drain and source of the transistor 101. The capacitance 105 is charged by the bias current Ib to keep the peak voltage Vp. The current source 104 is a current source of the bias current Ib, and applies the bias current Ib. Namely, the current source 104 is able to apply the current in the input terminal IN. A voltage drop of a threshold voltage Vth occurs in the diode 102 when the bias current Ib flows. The threshold voltage Vth is, for example, 0.6 V. Accordingly, the voltage Vi of the input terminal IN is represented by "Vi=Vp+Vth". A balance of the gate voltage Vp of the transistor 101 is kept with a voltage so that the current of IsH-Ib flows in the transistor 101. The input voltage Vi becomes enough higher than the peak voltage Vp. Accordingly, it is possible for the comparator 103 to normally output the high-level to the output terminal OUT when the high-level current IsH is inputted to the input terminal IN.

Figure 5:
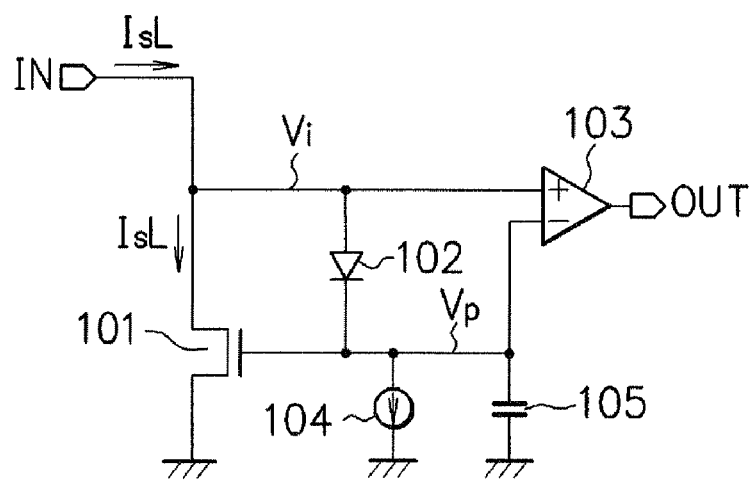
FIG. 5 is a circuit diagram to explain an operation of the demodulation circuit in FIG. 1 when the input current is in low-level.

FIG. 5 is a circuit diagram to explain the operation of the demodulation circuit in FIG. 1 when the input current Is is in low-level. The low-level current IsL flows in the input terminal IN. The low-level current IsL is a current which is enough smaller than the current IsH-Ib. In this case, the input voltage Vi becomes enough lower than the peak voltage Vp, the diode 102 is turned off, and the current does not flow. Incidentally, the peak voltage Vp keeps the peak voltage when the high-level current IsH flows owing to the capacitance 105. The input voltage Vi is enough lower than the peak voltage Vp, and therefore, it is possible for the comparator 103 to normally output the low-level to the output terminal OUT. Hereinafter, the reason why the input voltage Vi becomes enough lower than the peak voltage Vp is described with reference to FIG. 6.

Figure 6:
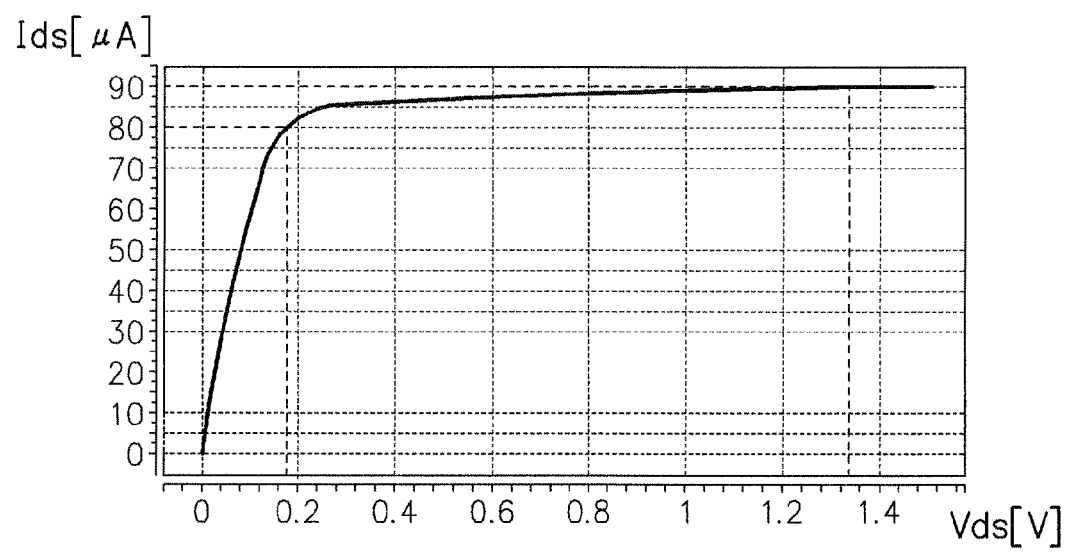
FIG. 6 is a characteristic chart illustrating a relationship between a drain-source voltage and a drain-source current of a transistor.

FIG. 6 is a characteristic chart illustrating a relationship between a drain-source voltage Vds and a drain-source current Ids of the transistor 101. A horizontal axis represents the drain-source voltage Vds [V] of the transistor 101, and a vertical axis represents the drain-source current Ids [μA] of the transistor 101. There is a characteristic in which a change of the voltage Vds becomes large even if a change of the current Ids is small in a saturation region of the transistor 101. If this characteristic is utilized, the input voltage Vi becomes enough low when the low-level current IsL flows compared to the case when the high-level current IsH flows. Accordingly, it is possible for the comparator 103 to normally output the high-level or the low-level in accordance with the level of the input current Is. Namely, it is possible to perform the normal demodulation even when the modulation rate of the input current Is is small. The modulation rate of the input current Is is represented by an amplitude/high-level current.

FIG. 7 to FIG. 10 are views illustrating simulation results of the input voltage Vi of the demodulation circuit in FIG. 1 when the high-level current IsH is 100 µA and the bias current Ib is 10 µA. When the high-level current IsH is 100 µA, the peak voltage Vp is approximately 1 V.

Figure 7:
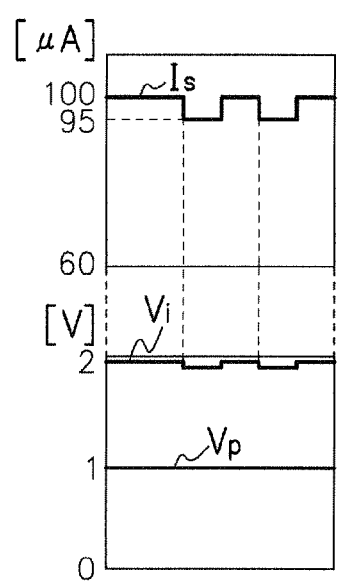
FIG. 7 is a view illustrating a simulation result of the demodulation circuit in FIG. 1 when a low-level input current is 95 µA.
Figure 8:
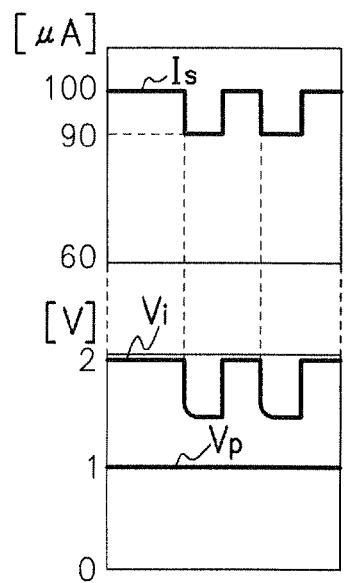
FIG. 8 is a view illustrating the simulation result of the demodulation circuit in FIG. 1 when the low-level input current is 90 µA.
Figure 9:
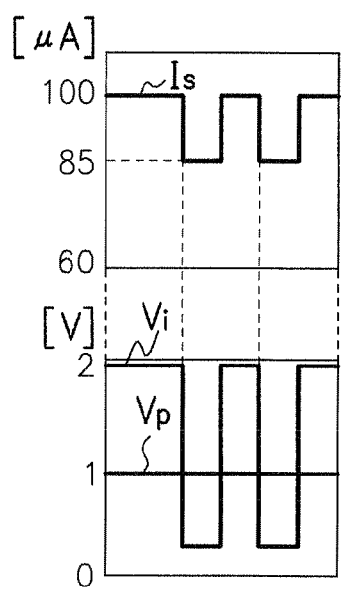
FIG. 9 is a view illustrating the simulation result of the demodulation circuit in FIG. 1 when the low-level input current is 85 µA.
Figure 10:
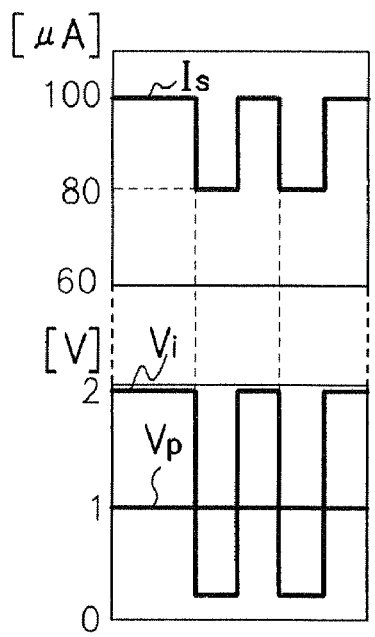
FIG. 10 is a view illustrating the simulation result of the demodulation circuit in FIG. 1 when the low-level input current is 80 µA.

The simulation results are respectively illustrated when the low-level current IsL is "IsH−0.5×Ib (=95 µA)" in FIG. 7, when the low-level current IsL is "IsH−Ib (=90 µA)" in FIG. 8, when the low-level current IsL is "IsH−1.5×Ib (=85 µA)" in FIG. 9, and when the low-level current IsL is "IsH−2×Ib (=80 µA)" in FIG. 10.

As illustrated in FIG. 8, when the low-level current IsL of 90 µA flows in the transistor 101, the drain-source voltage Vds of the transistor 101 becomes approximately 1.33 V, to be a relatively high value, as illustrated in FIG. 6. On the other hand, as illustrated in FIG. 10, when the low-level current IsL of 80 µA flows in the transistor 101, the drain-source voltage Vds of the transistor 101 becomes approximately 0.17 V, to be an enough low value, as illustrated in FIG. 6. As stated above, the drain-source voltage Vds changes largely for approximately 1.16 (=1.33−0.17) V according to the change of the current Ids flowing in the transistor 101 only for 10 µA.

It is not possible to perform the normal demodulation under states in FIG. 7 and FIG. 8, because the amplitude of the input voltage Vi is small and the input voltage Vi is constantly higher than the peak voltage Vp. On the other hand, it is possible to perform the normal demodulation under states in FIG. 9 and FIG. 10, because the amplitude of the input voltage Vi is large and the input voltage Vi is enough higher than the peak voltage Vp when the input voltage Vi is in high-level, and the input voltage Vi is enough lower than the peak voltage Vp when the input voltage Vi is in low-level.

As it can be seen from the above-stated results, it is possible to perform the demodulation normally when the amplitude of the input current Is is larger than the bias current Ib (=10 µA) (FIG. 9 and FIG. 10), and the bias current Ib plays a roll as a threshold value. In the ASK modulation, a rate between the high-level current IsH and the low-level current IsL is approximately defined, but an absolute value of the high-level current IsH changes depending on an output power of the reader/writer and a distance between the reader/writer and the tag. Accordingly, the bias current Ib is preferable to be in proportion to the high-level current IsH. The current source 104 of the bias current Ib is constituted by the current mirror as illustrated in FIG. 11, and thereby, it is possible to constantly obtain an optimal bias current Ib independent from the change of the high-level current IsH.

Figure 11:
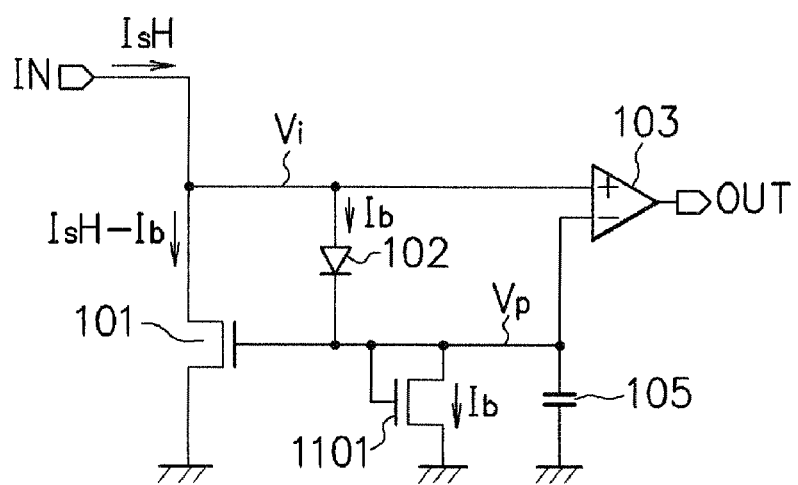
FIG. 11 is a circuit diagram illustrating a more concrete configuration example of the demodulation circuit in FIG. 1.

FIG. 11 is a circuit diagram illustrating a more concrete configuration example of the demodulation circuit in FIG. 1. The current source 104 in FIG. 1 can be constituted by an n-channel MOS field-effect transistor 1101 in FIG. 11. In the transistor 1101, a gate and a drain are connected to the gate of the transistor 101, and a source is connected to the reference potential. The transistor 1101 constitutes the current mirror between the transistor 101, and it is able to apply the bias current Ib. Accordingly, the transistor 1101 can apply the current in proportion to the current of the transistor 101. For example, when a size rate of the transistors 101 and 1101 is set to be 9:1, it is possible to apply the current of "IsH−Ib=90 µA" to the transistor 101, and the current of "Ib=10 µA" to the transistor 1101. At this time, the high-level current IsH is 100 µA.

Second Embodiment

Figure 12:
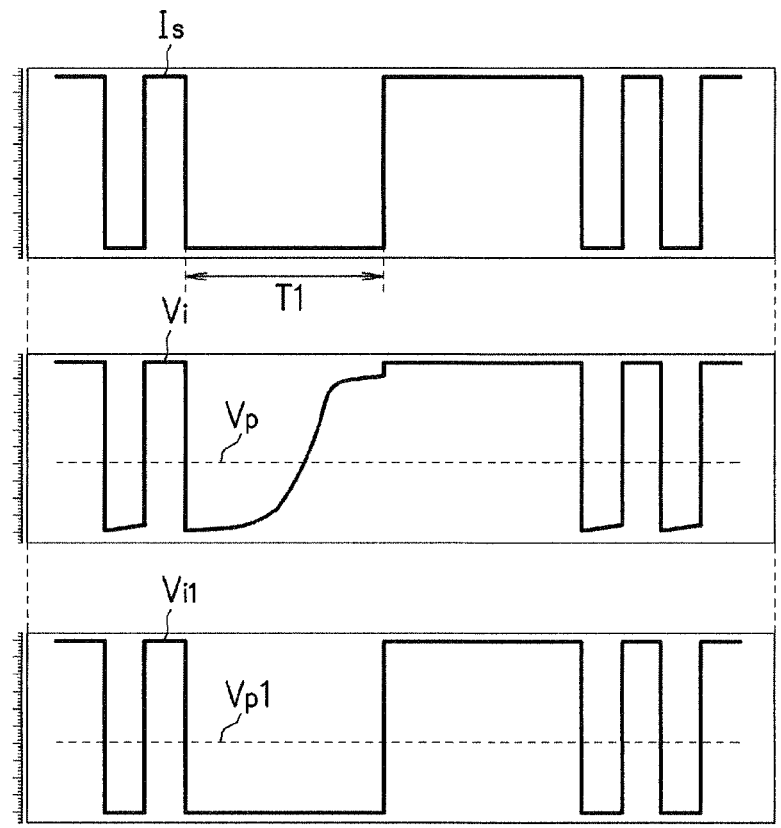
FIG. 12 is a timing chart illustrating an input voltage and a peak voltage when a low-level state of the input current continues for a long period of time in the demodulation circuit in FIG. 1.

FIG. 12 is a timing chart illustrating the input voltage Vi and the peak voltage Vp when the low-level state of the input current Is continues for a long period of time T1 in the demodulation circuit in FIG. 1. When the low-level state of the input current Is continues for a long time, an electric charge accumulated in the capacitance 105 is discharged via the current source 104, and the voltage Vp decreases gradually. However, the decreasing amount is very little such that it cannot be recognized in FIG. 12. Accordingly, the current flowing in the transistor 101 becomes small, and the voltage Vi becomes high. When the voltage Vi becomes higher than the voltage Vp, the comparator 103 erroneously outputs the high-level even though the input current Is is in low-level. It is not possible to perform the normal demodulation when the low-level time T1 is long. It is good if a capacitance value of the capacitance 105 is made large in accordance with lowness of a bit rate of the input current Is. However, there is a problem in which a cost becomes high to make an area of the capacitance 105 large so as to enlarge the capacitance value when the capacitance is housed inside an IC (integrated circuit), and therefore, there is a limit. In a second embodiment of the present invention, a demodulation circuit capable of performing a demodulation normally even when the low-level period T1 of the input current Is becomes long is provided.

Figure 13:
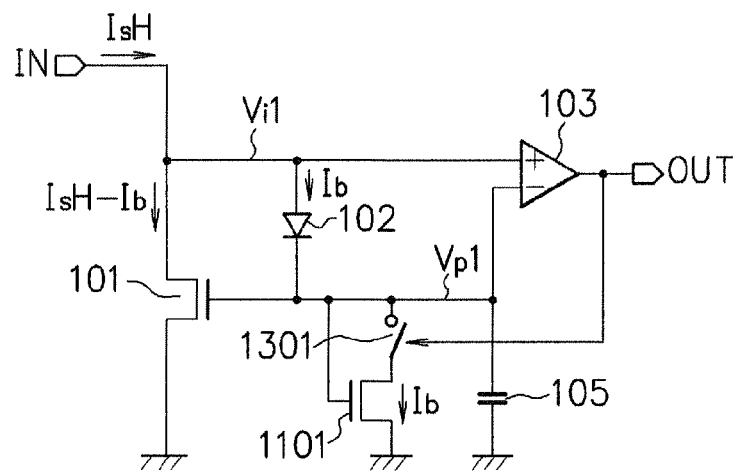
FIG. 13 is a circuit diagram illustrating a configuration example of a demodulation circuit according to a second embodiment of the present invention.

FIG. 13 is a circuit diagram illustrating a configuration example of the demodulation circuit according to the second embodiment of the present invention. The present embodiment (FIG. 13) is the one in which a switch 1301 is added to the first embodiment (FIG. 11). Here, a voltage of the input terminal IN is set as Vi1, and a gate voltage of the transistor 101 is set as Vp1. The switch 1301 is connected between the gate of the transistor 101 and the drain of the transistor 1101 of the current source, and interrupts the current flowing in the transistor 1101 of the current source in accordance with an output voltage (comparison result) of the comparator 103. The switch 1301 is closed when the output voltage of the comparator 103 is in high-level, and is opened when the output voltage of the comparator 103 is in low-level.

The input voltage Vi1 and the gate voltage Vp1 of the demodulation circuit in FIG. 13 are illustrated in FIG. 12. The switch 1301 is closed when the output voltage of the comparator 103 is in high-level, and therefore, a circuit configuration in FIG. 13 is the same as the one illustrated in FIG. 11. On the other hand, the switch 1301 is opened, the transistor 1101 of the current source is disconnected from the capacitance 105, and the bias current Ib does not flow in the transistor 1101 of the current source when the output voltage of the comparator 103 is in low-level. As a result, the electric charge accumulated in the capacitance 105 is not discharged, and the capacitance 105 is able to keep the peak voltage Vp1. Accordingly, the input voltage Vi1 is able to keep the low-level without being increased even during the low-level period T1 of the input current Is. As a result, the input voltage Vi1 keeps the low-level and the normal demodulation can be performed even in the case when the low-level period T1 of the input current Is becomes long. When the input current Is is in the low-level state, the switch 1301 is opened, and thereby, the capacitance 105 is able to keep the peak voltage Vp for a long time even when the capacitance value of the capacitance 105 is small.

Third Embodiment

Figure 14:
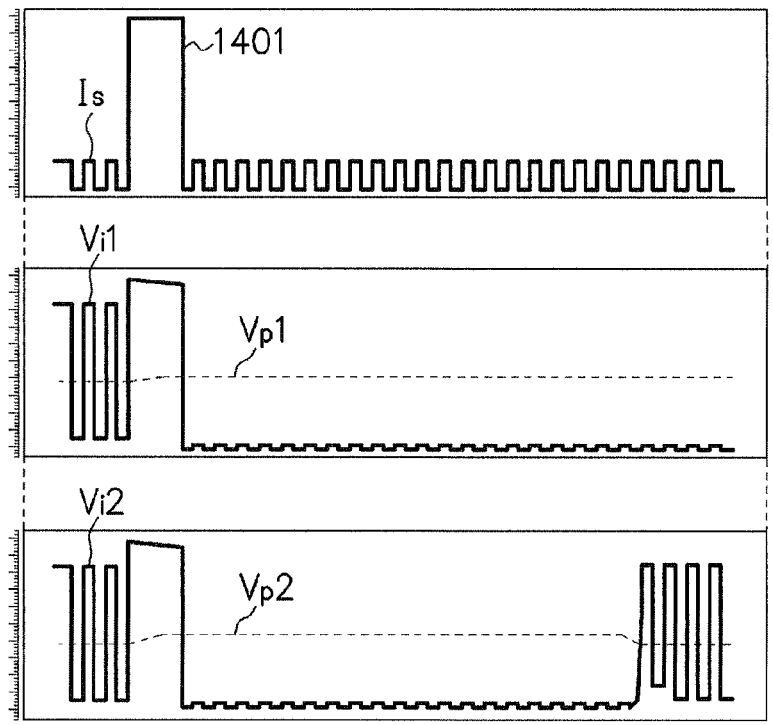
FIG. 14 is a timing chart illustrating an input voltage and a peak voltage when an abnormal signal of noise is inputted as an input current in the demodulation circuit in FIG. 13.

FIG. 14 is a timing chart illustrating the input voltage Vi1 and the peak voltage Vp1 when an abnormal signal 1401 of noise is inputted as the input current Is in the demodulation circuit in FIG. 13. The capacitance 105 and the diode 102 constitute a peak voltage detecting circuit, and detect and keep the peak voltage Vp. When the large current abnormal signal 1401 is inputted as the input current Is, the peak voltage Vp1 becomes high, and the capacitance 105 keeps the increased peak voltage Vp1. As a result, the transistor 101 applies a large current, and the input voltage Vi1 becomes low. When the input voltage Vi1 becomes low, the switch 1301 is opened, and the bias current Ib does not flow in the transistor 1101 of the current source. Accordingly, the capacitance 105 continues to keep the high peak voltage Vp1. The output terminal OUT is constantly in low-level to go into a deadlock state because the input voltage Vi1 is low even if the input current Is returns to the normal high-level signal or low-level signal. Namely, the transistor 1101 of the current source is disconnected by the switch 1301, a leak path of the capacitance 105 does not exist, and it goes into the deadlock state. A third embodiment of the present invention provides a demodulation circuit to avoid the deadlock state as stated above.

Figure 15:
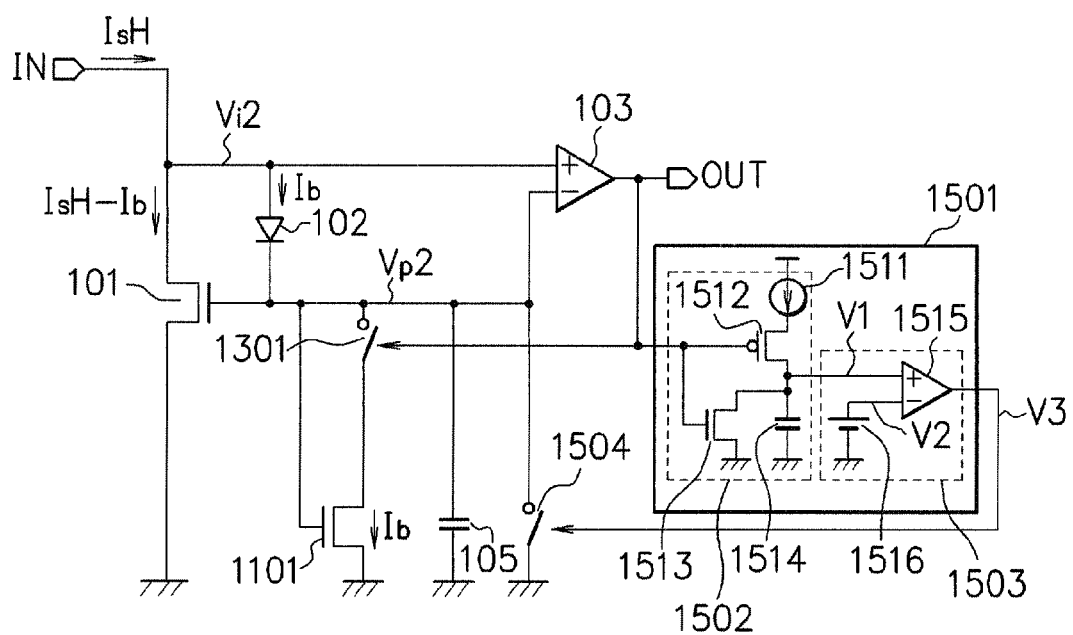
FIG. 15 is a circuit diagram illustrating a configuration example of a demodulation circuit according to a third embodiment of the present invention.

FIG. 15 is a circuit diagram illustrating a configuration example of the demodulation circuit according to the third embodiment of the present invention. In the present embodiment (FIG. 15), an abnormality detector 1501 and a switch 1504 are added to the second embodiment (FIG. 13). Here, a voltage of the input terminal IN is set as Vi2, and a gate voltage of the transistor 101 is set as Vp2.

The input voltage Vi2 and the gate voltage Vp2 of the demodulation circuit in FIG. 15 are illustrated in. FIG. 14. The abnormality detector 1501 closes the switch 1504, connects the gate of the transistor 101 to the reference potential, and decreases the gate voltage Vp2 of the transistor 101 when a time when the output voltage of the comparator 103 is in low-level (time when the input voltage Vi2 is lower than the peak voltage Vp2) is longer than a threshold value. On the contrary, the abnormality detector 1501L opens the switch 1504 to make the circuit configuration the same as the circuit configuration in FIG. 13, when the time when the output voltage of the comparator 103 is in low-level (time when the input voltage Vi2 is lower than the peak voltage Vp2) is shorter than the threshold value.

The abnormality detector 1501 has a timer 1502 and a comparison circuit 1503. The timer 1502 has a current source 1511, a p-channel MOS field-effect transistor 1512, an n-channel MOS field-effect transistor 1513 and a capacitance 1514, and outputs a voltage Vi in accordance with a time when the input voltage Vi2 is lower than the gate voltage Vp of the transistor 101. When the output voltage of the comparator 103 is in high-level, the transistor 1512 is turned off, the transistor 1513 is turned on, and the output voltage Vi of the timer 1502 is in low-level. When the output voltage of the comparator 103 is in low-level, the transistor 1512 is turned on, and the transistor 1513 is turned off. As a result, the capacitance 1514 is charged, and the output voltage Vi becomes high gradually. Namely, the timer 1502 outputs the voltage Vi in accordance with the time elapsed from the time when the output voltage of the comparator 103 is in low-level.

The comparison circuit 1503 has a comparator 1515 and a power source 1516. The power source 1516 generates a threshold voltage V2. The comparator 1515 compares the voltage Vi and the threshold voltage V2, and outputs a voltage V3 in low-level when the voltage Vi is lower than the threshold voltage V2. When the output voltage V3 is in low-level, the switch 1504 is opened to be the same circuit configuration as the one in FIG. 13. On the other hand, when the voltage Vi is higher than the threshold voltage V2, the comparator 1515 outputs the voltage V3 in high-level. When the output voltage V3 is in high-level, the switch 1504 is closed, and the gate of the transistor 101 is connected to the reference potential. The switch 1504 connects the gate of the transistor 101 to the reference potential in accordance with the output voltage (comparison result) V3 of the comparison circuit 1503. Accordingly, the gate voltage Vp2 of the transistor 101 becomes low, and the input voltage Vi2 becomes high. The input voltage Vi2 soon becomes higher than the gate voltage Vp2, and the comparator 103 outputs the high-level. The transistor 1512 is then turned off, the transistor 1513 is turned on, the voltage Vi becomes low-level, and the voltage V3 also becomes low-level. Accordingly, the switch 1504 is opened, the circuit operates as same as the operation of the circuit in FIG. 13, and is able to return to a normal demodulation operation.

As stated above, according to the present embodiment, it is possible to get away from the deadlock state by connecting the gate voltage Vp2 to the reference potential to reset it forcibly when the state in which the output voltage of the comparator 103 is in low-level continues for an abnormally long time.

Fourth Embodiment

Figure 16:
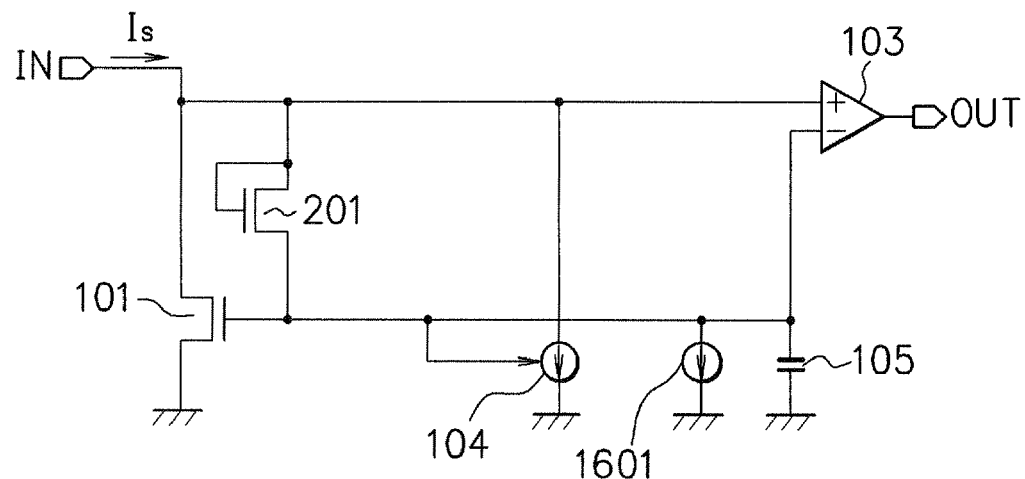
FIG. 16 is a circuit diagram illustrating a configuration example of a demodulation circuit according to a fourth embodiment of the present invention.

FIG. 16 is a circuit diagram illustrating a configuration example of a demodulation circuit according to a fourth embodiment of the present invention. In the present embodiment (FIG. 16), a leak current source 1601 is added to the first embodiment (FIG. 2). Incidentally, the bias current source 104 is connected between the input terminal IN and the reference potential, and a size of the current is controlled in accordance with the gate voltage of the transistor 101. The leak current source 1601 is connected between the gate of the transistor 101 and the reference potential. In the present embodiment, the leak current source 1601 is provided in addition to the current source 104 of the bias current Ib determining the threshold value. The leak current source 1601 is a current source to apply a current two-digits or three-digits smaller compared to the bias current source 104.

In the first to third embodiments, the bias current source 104 is connected in parallel to the capacitance 105, and therefore, the current source 104 becomes a factor discharging the electric charge accumulated in the capacitance 105 and decreasing the gate voltage of the transistor 101. In the present embodiment, the bias current source 104 is connected between the input terminal IN and the reference potential, and thereby, it is possible to prevent the discharge of the capacitance 105, and the decrease of the gate voltage of the transistor 101. However, a leak path to apply a leak current of the capacitance 105 is necessary, and therefore, the leak current source 1601 is provided. The current which is applied from the leak current source 1601 is extremely small, and therefore, it is possible to prevent the decrease of the gate voltage of the transistor 101.

When a high-level value of the input current Is becomes small, the voltage of the input terminal IN is lowered. It is possible to make the bias current Ib of the bias current source 104 small in accordance with the above. At least, when the voltage of the input terminal IN is higher than the gate voltage of the transistor 101, the bias current Ib of the bias current source 104 is set to be almost "0" (zero). According to this operation, the voltage of the input terminal IN is kept at the voltage higher than the gate voltage of the transistor 101 even though the voltage of the input terminal IN decreases when the decrease of the input current Is is smaller than the bias current Ib. On the contrary, the voltage of the input terminal IN becomes lower than the gate voltage of the transistor 101 when the decrease of the input current Is is larger than the bias current Ib. According to the present embodiment, the size of the bias current Ib is changed in accordance with the size of the input current Is, and therefore, it is possible to perform the demodulation normally even when the input current Is becomes small.

Figure 17:
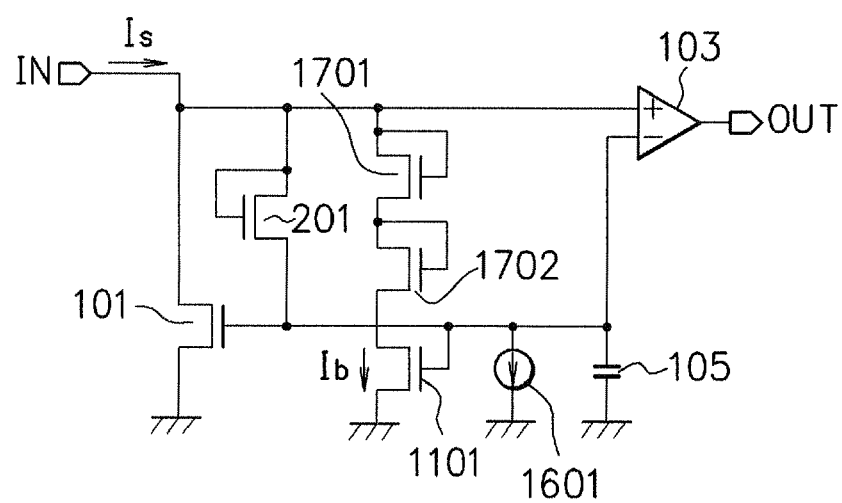
FIG. 17 is a circuit diagram illustrating a more concrete configuration example of the demodulation circuit in FIG. 16.

FIG. 17 is a circuit diagram illustrating a more concrete configuration example of the demodulation circuit in FIG. 16. The n-channel MOS field-effect transistor 1101 corresponds to the bias current source 104 in FIG. 16, the gate is connected to the gate of the transistor 101, the drain is connected to the input terminal IN via transistors (load) 1701 and 1702, and the source is connected to the reference potential. In the n-channel MOS field-effect transistor 1701, a gate and a drain are connected to the input terminal IN, a source is connected to a gate and a drain of the n-channel MOS field-effect transistor 1702. A source of the transistor 1702 is connected to the drain of the transistor 1101. The transistors 1701, 1702 are diode loads, each of them generates a voltage drop of, for example, a threshold voltage of 0.6 V to generate the voltage drop of 1.2 V as a total.

As stated above, the demodulation circuits according to the first to fourth embodiments have the transistors, the diode, the capacitance, and the bias current source. The gate voltage Vp of the transistor 101 is balanced so that the current in which the threshold current Ib is subtracted from the high-level input current IsH flows in the transistor 101. The capacitance 105 stores the gate voltage of the transistor 101. A drain voltage Vi of the transistor 101 when the high-level input current IsH flows is designed to be a voltage higher than the reference voltage Vp. The low-level input current IsL is smaller than a current value in which the threshold current Ib is subtracted from the high-level input current IsH. The drain voltage Vi of the transistor 101 when the low-level input current IsL flows is designed to be a voltage lower than the reference voltage Vp. Incidentally, bipolar transistors may be used instead of the above-stated field-effect transistors.

Next, effects of the first to fourth embodiments are described. It is assumed that the high-level input current IsH is "1" (relative value) the low-level input current IsL is "0.8" (relative value), and a noise is "0.01" (relative value), and a demodulation circuit in FIG. 19 and the demodulation circuits in the first to fourth embodiments are compared.

In the demodulation circuit in FIG. 19, an optimal value of a threshold current It is when it is "0.9" (relative value). A variation of the threshold current It allowed by the noise is "0.81" to "0.99" (relative values), and it is ±10% from the optimal value. A reference of the variation of the threshold current It is "0" (zero), and therefore, only a small range of ±10% from the optimal value is allowed.

On the other hand, in the first to fourth embodiments, an optimal value of the bias current Ib being the threshold value is "0.1" (relative value). For example, the high-level input current IsH is 100 μA, the low-level input current IsL is 80 μA, and the bias current Ib is 10 μA. A variation of the threshold current Ib allowed by the noise is "0.01" to "0.19" (relative values), and it is ±90% from the optimal value. A reference of the variation of the threshold current Ib is the high-level input current IsH, and therefore, a large range of ±90% from the optimal value is allowed. In the demodulation circuits in the first to fourth embodiments, the variation of nine times compared to the demodulation circuit in FIG. 19 is allowed, and the yield can be improved.

Incidentally, the above-described embodiments are to be considered in all respects as illustrative and no restrictive. Namely, the present invention may be embodied in other specific forms without departing from the spirit or essential characteristics thereof.

INDUSTRIAL APPLICABILITY

A high accurate demodulation with high noise resistance is enabled, and it is possible to improve a yield of a demodulation circuit.

What is claimed is:
1. A demodulation circuit, comprising:
an input terminal inputting a current amplitude modulated signal;
a first transistor connected to said input terminal;
a capacitance connected to a control terminal of said first transistor;
a diode connected between said input terminal and the control terminal of said first transistor;
a first current source applying a current of said input terminal; and
a first comparator comparing a voltage of said input terminal and a voltage of the control terminal of said first transistor.

2. The demodulation circuit according to claim 1, further comprising:
a switch interrupting the current flowing in said first current source in accordance with a comparison result of said first comparator.

3. A demodulation circuit, comprising:
an input terminal inputting a current amplitude modulated signal;
a first transistor connected to said input terminal;
a capacitance connected to a control terminal of said first transistor;
a diode connected between said input terminal and the control terminal of said first transistor; and
a first current source applying a current of said input terminal,
wherein said diode is constituted by a field-effect transistor of which gate and drain are mutually connected.

4. The demodulation circuit according to claim 1, wherein said first current source is connected to the control terminal of said first transistor.

5. A demodulation circuit, comprising:
an input terminal inputting a current amplitude modulated signal;
a first transistor connected to said input terminal;
a capacitance connected to a control terminal of said first transistor;
a diode connected between said input terminal and the control terminal of said first transistor; and
a first current source applying a current of said input terminal,
wherein said first current source is connected to the control terminal of said first transistor and includes a field-effect transistor of which gate and drain are connected to the control terminal of said first transistor.

6. The demodulation circuit according to claim 1, further comprising:
   an abnormality detector lowering the voltage of the control terminal of said first transistor when a time when the voltage of said input terminal is lower than the voltage of the control terminal of said first transistor is longer than a threshold value.

7. The demodulation circuit according to claim 6, wherein said abnormality detector includes:
   a timer outputting a voltage in accordance with the time when the voltage of said input terminal is lower than the voltage of the control terminal of said first transistor;
   a second comparator comparing the voltage outputted from the timer and a threshold value; and
   a switch connecting the control terminal of said first transistor to a reference potential in accordance with a comparison result of the second comparator.

8. The demodulation circuit according to claim 1, further comprising:
   a second current source connected to the control terminal of said first transistor,
   wherein said first current source is connected to said input terminal.

9. The demodulation circuit according to claim 8, wherein a size of the current in said first current source is controlled in accordance with the voltage of the control terminal of said first transistor.

10. The demodulation circuit according to claim 8, wherein said first current source is constituted by a field-effect transistor of which gate is connected to the control terminal of said first transistor and drain is connected to said input terminal.

11. The demodulation circuit according to claim 10, wherein a drain of the field-effect transistor is connected to said input terminal via a load.

12. The demodulation circuit according to claim 1, wherein said diode is constituted by a field-effect transistor of which gate and drain are mutually connected.

13. The demodulation circuit according to claim 12, wherein said first current source is constituted by a field-effect transistor of which gate and drain are connected to the control terminal of said first transistor.

14. The demodulation circuit according to claim 13, further comprising:
   a first switch interrupting the current flowing in said first current source in accordance with a comparison result of said first comparator.

15. The demodulation circuit according to claim 14, further comprising:
   an abnormality detector lowering the voltage of the control terminal of said first transistor when a time when the voltage of said input terminal is lower than the voltage of the control terminal of said first transistor is longer than a threshold value.

16. The demodulation circuit according to claim 15, wherein said abnormality detector includes:
   a timer outputting a voltage in accordance with the time when the voltage of said input terminal is lower than the voltage of the control terminal of said first transistor;
   a second comparator comparing the voltage outputted from the timer and a threshold value; and
   a second switch connecting the control terminal of said first transistor to a reference potential in accordance with a comparison result of the second comparator.

17. The demodulation circuit according to claim 1, further comprising:
   a second current source connected to the control terminal of said first transistor,
   wherein said first current source is connected to said input terminal.

18. The demodulation circuit according to claim 17, wherein said first current source is constituted by a field-effect transistor of which gate is connected to the control terminal of said first transistor, and drain is connected to said input terminal.

19. The demodulation circuit according to claim 18, wherein a drain of the field-effect transistor is connected to said input terminal via a load.

* * * * *